(12) United States Patent
Gawer et al.

(10) Patent No.: US 9,437,403 B2
(45) Date of Patent: Sep. 6, 2016

(54) ASSEMBLY FOR FEEDING IN HF CURRENT FOR TUBULAR CATHODES

(71) Applicant: FHR ANLAGENBAU GMBH, Ottendorf-Okrilla (DE)

(72) Inventors: Olaf Gawer, Dresden (DE); Sascha Kreher, Dresden (DE)

(73) Assignee: FHR ANLAGENBAU GMBH, Ottendorf-Okrilla (DE)

( * ) Notice: Subject to any disclaimer, the term of this patent is extended or adjusted under 35 U.S.C. 154(b) by 0 days.

(21) Appl. No.: 14/357,285

(22) PCT Filed: Nov. 9, 2012

(86) PCT No.: PCT/EP2012/072235
§ 371 (c)(1),
(2) Date: May 22, 2014

(87) PCT Pub. No.: WO2013/068524
PCT Pub. Date: May 16, 2013

(65) Prior Publication Data
US 2014/0332375 A1    Nov. 13, 2014

(30) Foreign Application Priority Data
Nov. 10, 2011 (DE) .................. 10 2011 086 111

(51) Int. Cl.
*C23C 14/00* (2006.01)
*C25B 11/00* (2006.01)
(Continued)

(52) U.S. Cl.
CPC ........ *H01J 37/3411* (2013.01); *H01J 37/3405* (2013.01); *H01J 37/3438* (2013.01); *H01J 37/3444* (2013.01)

(58) Field of Classification Search
CPC .................. H01J 37/3411; H01J 37/3444
See application file for complete search history.

(56) References Cited

U.S. PATENT DOCUMENTS 4,496,448 A * 1/1985 Tai ............... H01J 37/32082
                                              204/192.32
5,213,672 A * 5/1993 Hartig ............ C23C 14/3407
                                              204/298.06
(Continued)

FOREIGN PATENT DOCUMENTS

DE     202006005011 U1    3/2007
DE     112008000912 T5    2/2010

OTHER PUBLICATIONS

Liu, C., et al., Coupling Study of a Rotary Capacitive Power Transfer System, ICIT '09 Proceedings of the Dec. 2009 IEEE International Conference on Industrial Technology, IEEE Computer Society Washington, DC, USA.*

(Continued)

*Primary Examiner* — Ibrahime A Abraham
(74) *Attorney, Agent, or Firm* — Heslin Rothenberg Farley & Mesiti P.C.

(57) ABSTRACT

An arrangement is provided for feeding in HF current for rotatable tubular cathodes in a vacuum chamber of a plasma coating system as well as a high frequency current source. Located inside the tubular cathode is a magnet arrangement that extends along said tubular cathode for generating a magnetic field. The arrangement enables a low loss infeed of HF current, so that a particularly homogeneous sputter removal from the tubular cathode is guaranteed. The HF current source is coupled to the tubular cathode inside the vacuum chamber by a capacitive infeed of HF current in the form of a coupling capacitor. The coupling capacitor includes a part of the surface of the tubular cathode and a metal plate or metal film that surrounds the tubular cathode, at least partially, at a specified distance.

11 Claims, 2 Drawing Sheets

Figure 1:
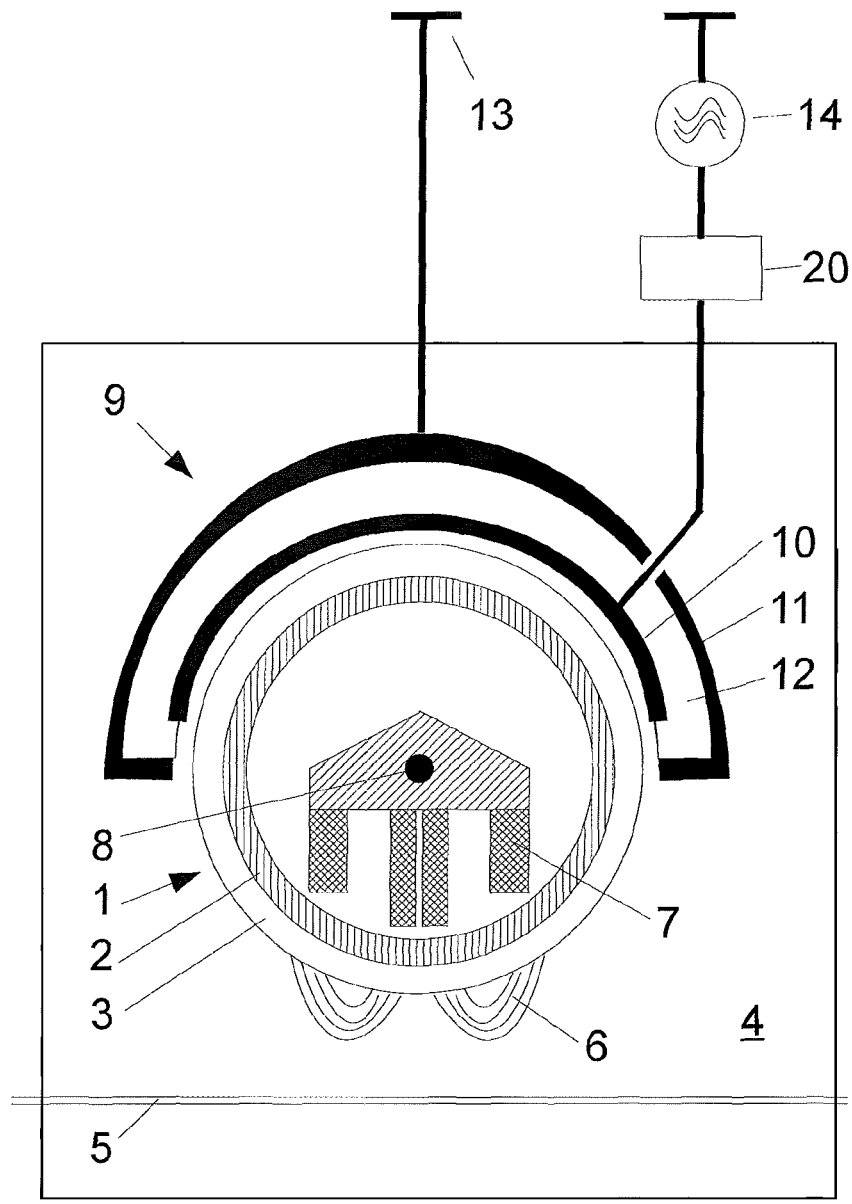

(51) Int. Cl.
  *C25B 13/00* (2006.01)
  *H01J 37/34* (2006.01)

(56) References Cited

U.S. PATENT DOCUMENTS

| | | |
|---|---|---|
| 6,692,619 B1 | 2/2004 | Chen et al. |
| 6,825,618 B2 * | 11/2004 | Pu .................. H01J 37/321 |
| | | 118/723 I |
| 2002/0189939 A1 | 12/2002 | German et al. |
| 2003/0042131 A1 | 3/2003 | Johnson |
| 2004/0140208 A1 * | 7/2004 | German et al. .......... 204/298.21 |
| 2008/0012460 A1 | 1/2008 | Bernick et al. |
| 2010/0206718 A1 | 8/2010 | Li et al. |
| 2013/0043762 A1 * | 2/2013 | Ludois et al. ................. 310/219 |

OTHER PUBLICATIONS

International Search Report for PCT/EP2012/072235 dated Mar. 14, 2013.

* cited by examiner

ASSEMBLY FOR FEEDING IN HF CURRENT FOR TUBULAR CATHODES

CROSS REFERENCE TO RELATED APPLICATIONS

This application is a national stage filing under section 371 of International Application No. PCT/EP2012/072235 filed on Nov. 9, 2012, and published in German on May 16, 2013 as WO 2013/068524 A1 and claims priority of German patent application No. 10 2011 086 111.4 filed on Nov. 10, 2011, the entire disclosure of these applications being hereby incorporated herein by reference.

BACKGROUND ART

The invention relates to an arrangement for feeding in high frequency (HF) current for rotatable tubular cathodes in a vacuum chamber of a plasma coating system as well as a high frequency current source and, located inside said tubular cathode, a stationary magnet arrangement that extends along said tubular cathode, in order to fulfill the objective of generating a magnetic field.

Rotatable tubular cathodes usually consist of a support tube and a target shell, which surrounds said support tube, and are used in plasma coating systems for coating predominantly substrates having a large surface area in a vacuum chamber. During the coating process in the vacuum chamber the substrates, such as plates, sheets or wide metal strips or wide plastic strips or films, pass at a specified distance beneath the tubular cathode. Hence, the length of such tubular cathodes can easily amount to several meters. The HF current that is required to ignite a plasma between the tubular cathode and an anode (substrate) is fed to the tubular cathode over commutator systems with carbon brushes or other sliding contacts and, in particular, outside or inside the vacuum chamber. Furthermore, a stationary magnet arrangement, which extends over the entire length of the tubular cathode, is also located in the tubular cathode and, thus, does not rotate with the tubular cathode.

Working on the aforesaid, the DE 20 2002 005 011 U1 shows such a current infeed for a tubular cathode outside the vacuum chamber, wherein said current infeed extends into the vacuum chamber by means of a vacuum tight rotary feedthrough. The tubular cathode is mounted only on one side and, in particular, on the side of the rotary feedthrough. The disadvantage here is that in the course of feeding in the HF current the vacuum feedthrough is subjected, in particular, to thermal loading due to the eddy currents, which are generated, and, as a result, can begin to leak over time.

Moreover, longer tubular cathodes have to be mounted or rather supported at both ends (DE 10 2006 017 455 A1), in order to guarantee a uniform distance from the substrate over the entire length of said tubular cathodes.

US 2002 0189 939 A1 discloses an infeed of alternating current for tubular cathodes by way of carbon brushes, wherein this alternating current infeed is located inside the vacuum chamber. However, the problem here is that the abrasive wear resulting from the carbon brushes can contaminate the vacuum, so that the vacuum chamber has to be cleaned on a regular basis or even during the sputtering process.

However, both embodiments have the problem that when an HF current is fed in, the current propagates primarily by means of surface conduction to the surface of the tubular cathode, but at a current density that is locally quite different. Thus, the current density in the vicinity of the infeed point is particularly high, whereas at the other end of the tubular cathode a lower current density is observed. The result is a non-homogeneous sputter removal.

In addition and beyond the above described problem, commutator systems with carbon brushes are suitable only to a limited extent for the implementation of an infeed of high frequency current.

At this point the object of the present invention is to provide an arrangement that is designed for feeding in a HF current for tubular cathodes and that enables a uniform infeed of the HF current, so that a particularly homogeneous sputter removal from the tubular cathode is guaranteed.

BRIEF SUMMARY OF INVENTION

This engineering object is achieved by means of an arrangement of the type described in the introductory part of the specification in that the high frequency current source is coupled to the tubular cathode inside the vacuum chamber by means of a capacitive infeed of HF current in the form of a coupling capacitor.

The coupling capacitor of the HF infeed consists of a part of the surface of the tubular cathode and a metal plate or metal film that surrounds the tubular cathode at least partially at a specified distance.

In order to achieve a maximum capacitance of the coupling capacitor, the metal plate or metal film extends more or less over the entire free length of the tubular cathode in the vacuum chamber.

In continuation of the invention, the metal plate or metal film has the shape of a semi-cylinder that is arranged at a uniform specified distance from the tubular cathode.

The semi-cylinder is located diametrically opposite the magnet arrangement in the tubular cathode. Thus, on the one hand, a maximum capacitance of the coupling capacitor is ensured; and, on the other hand, the sputtering process is not impeded by the coupling capacitor.

The distance between the tubular cathode and the metal plate or metal film or more specifically the semi-cylinder amounts to a few millimeters and preferably approximately 2 mm.

In one embodiment of the invention the gap between the tubular cathode and the metal plate or metal film is adjustable. This feature makes it possible to make a readjustment as function of the decreasing diameter of the tubular target due to the wear caused by particle removal, so that the capacitance of the HF infeed can be kept largely constant during the service life of the tubular target.

Furthermore, the HF infeed is provided with a shielding on the rear side by means of dark field shielding.

Between the rear side of the metal plate or metal film and the shielding there is an insulation that is made of a synthetic plastic material with sufficient flexural rigidity and that reduces at the same time a reactive current. In addition, the insulation material serves to increase the mechanical stability of the infeed of HF current, so that a uniform distance from the tubular target is guaranteed over the entire length and width of said HF infeed.

The shielding is connected to ground.

In an alternative embodiment of the invention the HF infeeds are provided analogously in each instance at the two ends of the tubular cathode.

In an additional alternative embodiment of the invention, the HF infeeds are provided at both ends of the tubular cathode in the form of metallic sleeves.

The coupling capacitor of the infeed is a component of the matching network of the HF power supply.

BRIEF DESCRIPTION OF DRAWING FIGURES

Figure 2:
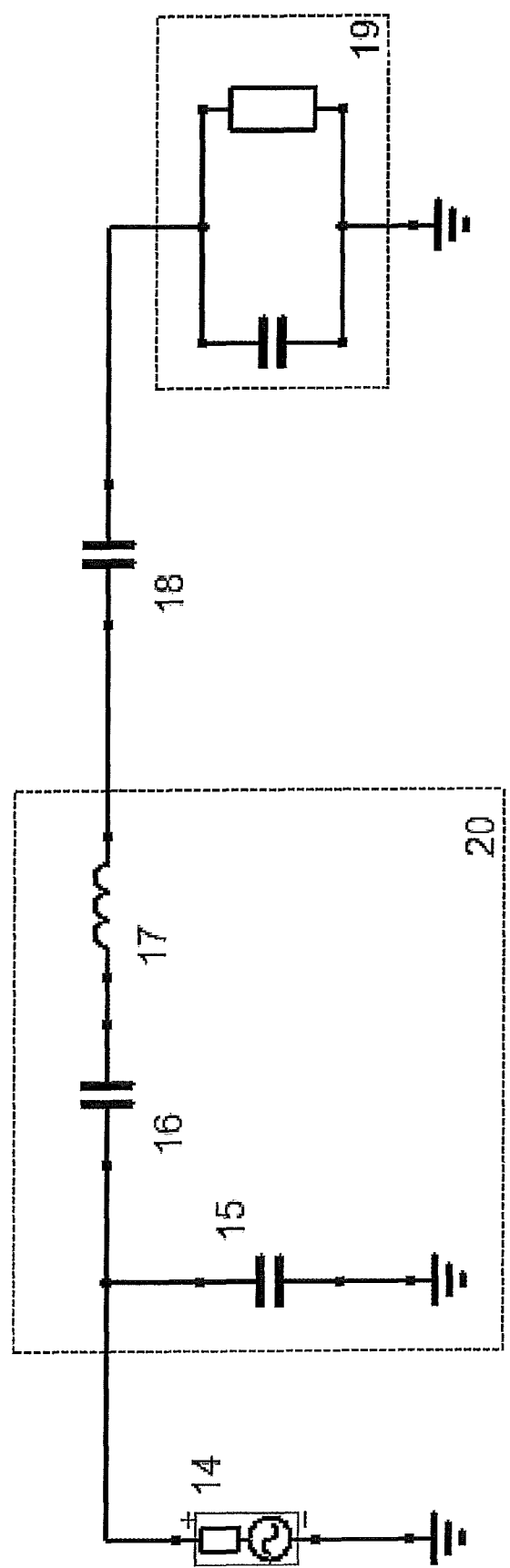

The invention will be explained in more detail below by means of one exemplary embodiment. The accompanying drawings show in:

FIG. 1 in schematic form an end view of the HF infeed in accordance with the invention; and FIG. 2 a simplified equivalent circuit diagram of the HF infeed.

DETAILED DESCRIPTION

FIG. 1 shows a tubular cathode 1, consisting of a support tube 2 and a target shell 3, in a vacuum chamber 4. The target shell 3 may be pushed onto the support tube 2 or can be cast integrally with said support tube or can be fastened to said support tube in some other way. During the sputtering process, material is removed from this target shell 3 and is deposited on a substrate 5, which passes beneath the tubular cathode 1 and which is shown here in schematic form as a strip. For this purpose it is necessary, on the one hand, to ignite a plasma in the vacuum chamber 4. In order to ignite this plasma, an HF current is fed, for example, into the tubular cathode 1; and, on the other hand, a magnetic field 6 is generated, in order to focus the plasma 6 in the direction of the substrate 5. It goes without saying that the length of the tubular cathode 1 has to be equivalent to at least the width of the substrate 5.

The required magnetic field 6 is generated by means of a magnet arrangement 7 inside the tubular cathode 1 that is located opposite the substrate 5. In order for the magnet arrangement 7 to continue to remain stationary even in the event that the tubular cathode 1 is rotating, i.e. the magnet arrangement does not rotate with said tubular cathode, said magnet arrangement is fastened to an axis of rotation 8, about which the tubular cathode 1 also rotates, and maintains this position of the magnet arrangement 7 even if the tubular cathode 1 is rotating.

The HF current is fed into the tubular cathode 1 by way of a capacitive infeed 9 of the HF current that consists of a part of the surface of the tubular cathode 1 and a metal plate or metal film 10, forming a coupling capacitor 18. The metal plate or metal film 10 has the shape of a semi-cylinder. This metal plate or metal film 10 surrounds approximately half of the rotatable tubular cathode 1 on the side of the tubular cathode 1 that lies diametrically opposite the magnet arrangement 7. The distance between the metal plate or metal film 10 and the tubular cathode 1 should be a few millimeters, preferably approximately 2 mm. In this arrangement the coupling capacitance of the coupling capacitor 18 of the HF infeed 9 is equivalent to half of the coaxial capacitance.

In the case of a large tubular cathode that has a conductive target and the following output data length of the tubular cathode: 2,000 mm
distance: 2 mm
outside diameter: 133 . . . 140 mm, the coupling capacitance of the HF infeed is 3.9 nF. In the case of an L circuit, the magnitude of the series capacitance 16 is, in general, 12 . . . 500 pF. Hence, in the equivalent circuit (series circuit of series capacitance 16 and coupling capacitance 18) the net result is a total output capacitance of 12 . . . 443 pF. Thus, the total capacitance is determined by the distance between the metal plate or the metal film 10 and the tubular cathode 1.

Similar values are obtained for non-conductive targets in the millimeter range with high relative permittivity, such as aluminum oxide.

In order to achieve a maximum capacitance of the coupling capacitor, which is formed between the metal plate or the metal film 10 and the tubular cathode 1, the metal plate or the metal film 10 should extend more or less over the entire free length of the tubular cathode 1 inside the vacuum chamber 1.

By positioning the HF infeed 9 according to the drawing above the tubular cathode 1, it is ensured that the sputtering process will not be impeded by the HF infeed 9.

Furthermore, the metal plate or metal film 10 of the HF infeed 9 is surrounded on its rear side, i.e. the side facing away from the tubular cathode 1, by a shielding 11 by means of dark field shielding.

Between the rear side of the metal plate or metal film 10 and the shielding 11 there is an insulation 12, so that the result is a type of sandwich arrangement that at the same time reduces a reactive current. The insulation 12 is made of a suitable synthetic plastic material with sufficient mechanical stability, so that in the case of particularly long HF infeeds 9 sagging of said HF infeed can be largely avoided. This feature is necessary in order to ensure a uniform distance between the target shell 3 and the metal plate or the metal film 10 over the entire length of the tubular cathode 1 and, thus, to guarantee a uniform infeed of the HF current.

The shielding 11 is connected to ground 13. In addition, the insulation 12 between the metal plate or the metal film 10 and the shielding 11 is used to increase the mechanical stability of the HF infeed 9.

The metal plate or metal film 10 of the HF infeed 9 is connected by means of a matching network 20 to an HF current source 14, which is located outside the vacuum chamber 4.

The above described HF infeed 9 guarantees a sufficiently uniform, low loss infeed of the HF current into the tubular cathode 1.

During the sputtering process, material is constantly removed from the target shell 3, so that the diameter of said target shell decreases continuously. This in turn would result in a decrease in the capacitance between the metal plate or metal film 10 and the tubular cathode 1, i.e., the target shell 3. The result is an increasing reactance for the infeed of the HF current, which can be adjusted only to a limited extent by means of the matching network 20.

In order to counteract this situation, the gap between the tubular cathode 1 and the metal plate or metal film 10 is adjustable. This feature makes it possible to readjust the HF infeed 9, as a function of the decreasing diameter of the target shell 3, with respect to the tubular target 1. For this purpose only the change in the infeed impedance has to be measured directly or indirectly and has to be kept, for example, constant at approximately 2 mm in accordance with the distance between the metal plate or metal film 10 and the target shell 3.

In an alternative embodiment of the invention, HF infeeds 9 are provided in each case at the two ends of the tubular cathode 1. For this purpose metal plates or metal films 10, which are formed as a semi-cylinder, are disposed in the end regions of the tubular cathode 1. Each of these metal plates or metal films is provided, as described above, with a shielding 11 and in-between with an insulation 12. As a result, the larger central part of the tubular cathode 1 is not covered in part by an HF infeed, i.e. is exposed.

The infeeding of the HF current is performed starting from the two HF infeeds 9, which can also be readjusted, as described above, as a function of the decrease in the diameter of the target shell 3.

As an alternative, HF infeeds can also be provided at both ends of the tubular cathode 1 in the form of metallic sleeves, each of which is connected to the HF current source 14. Since in this case no material can be removed from the target shell in the region of the two metal sleeves, there is also no need to have to change the distance between the metal sleeves and the target shell 3 of the tubular cathode 1. The capacitance between the metal sleeves and the target shell 3 stays largely constant during the service life of the target shell 3.

FIG. 2 shows a simplified equivalent circuit diagram of the HF infeed with the HF power supply 14, the matching network 20, consisting of a series capacitance 16, a parallel capacitance 15 and a coil 17, as well as a schematic equivalent circuit diagram 19 for the plasma. The coupling capacitor 18 of the HF infeed 9 can also be used as a capacitor of the matching network or can replace or expand said capacitor of the matching network.

The invention claimed is:

1. An arrangement for feeding in HF current for a rotatable tubular cathode serving as a sputtering target in a vacuum chamber of a plasma coating system, the rotatable tubular target comprising a support tube supporting a target shell, the target shell comprising target material to be removed during sputtering and deposited on a substrate, in combination with a high frequency current source and a matching network and, located inside said tubular cathode, a stationary magnet arrangement that extends along said tubular cathode, wherein the HF current source is coupled via the matching network to the tubular cathode inside the vacuum chamber by a coupling capacitor, the coupling capacitor consisting of a part of a surface of the tubular cathode and a metal plate or metal film surrounding approximately half of the rotatable tubular cathode at a specified distance from said surface, wherein the metal plate or metal film extends substantially over an entire free length of the tubular cathode inside the vacuum chamber, and wherein the metal plate or metal film is located diametrically opposite the stationary magnet arrangement so as not to impede sputtering of the target material of the target shell, and wherein the coupling capacitor serves as a capacitor of the matching network or the coupling capacitor replaces a capacitor of the matching network at the same time as serving as a capacitive infeed of HF current to the rotatable tubular cathode, and wherein the specified distance is readjusted during sputtering as a function of decreasing diameter of the tubular cathode due to removal of target material from the target shell.

2. Arrangement, as claimed in claim 1, wherein the metal plate or metal film has a semi-cylinder shape that is arranged at a uniform specified distance from the tubular cathode.

3. Arrangement, as claimed in claim 1, wherein the specified distance comprises approximately 2 mm.

4. Arrangement, as claimed in claim 1, wherein the metal plate or metal film is provided with a dark field shielding.

5. Arrangement, as claimed in claim 4, wherein an insulation is arranged between the metal plate or metal film and the shielding, the insulation reducing reactive current while simultaneously ensuring a uniform specified distance over an entire length and width of the coupling capacitor.

6. Arrangement, as claimed in claim 4, wherein the shielding is connected to ground.

7. An arrangement for feeding in HF current for a rotatable tubular cathode serving as a sputtering target in a vacuum chamber of a plasma coating system, the rotatable tubular cathode comprising a support tube supporting a target shell, the target shell comprising target material to be removed during sputtering and deposited on a substrate, in combination with a high frequency current source and a matching network and, located inside said tubular cathode, a stationary magnet arrangement that extends along said tubular cathode, wherein the HF current source is coupled via the matching network to the tubular cathode inside the vacuum chamber by a coupling capacitor, the coupling capacitor comprising a part of a surface of the tubular cathode and a metal plate or metal film that surrounds the tubular cathode at least partially at a specified distance from said surface, wherein the metal plate or metal film is provided only at both ends of the tubular cathode so as to not impede sputtering of the target material of the target shell, and wherein the coupling capacitor serves as a capacitor of the matching network or the coupling capacitor replaces a capacitor of the matching network at the same time as serving as a capacitive infeed of the HF current to the rotatable tubular cathode, and wherein the specified distance is readjusted during sputtering as a function of decreasing diameter of the tubular cathode due to removal of target material from the target shell.

8. Arrangement, as claimed in claim 7, wherein the metal plate or metal film provided only at both ends of the tubular cathode comprises sleeves fully surrounding the ends of the tubular cathode.

9. Arrangement, as claimed in claim 1, wherein the coupling capacitor is a component of the matching network of the HF power supply, the matching network further comprising a capacitor and a coil in series with the coupling capacitor, and a parallel capacitor.

10. Arrangement, as claimed in claim 5, wherein the insulation comprises a synthetic plastic material sandwiched between the metal plate or metal film and the dark field shielding.

11. Arrangement, as claimed in claim 7, wherein the metal plate or metal film has a semi-cylinder shape and is surrounded on a rear side facing away from the tubular cathode by dark field shielding, with insulation sandwiched between the rear side of the metal plate or metal film and the shielding reducing a reactive current.

* * * * *